United States Patent
Finkelman et al.

(10) Patent No.: US 11,328,944 B2
(45) Date of Patent: May 10, 2022

(54) SYSTEMS AND METHODS OF PLACING SUBSTRATES IN SEMICONDUCTOR MANUFACTURING EQUIPMENT

(71) Applicant: Eugenus, Inc., San Jose, CA (US)

(72) Inventors: Alex Finkelman, San Jose, CA (US); Somilkumar J. Rathi, San Jose, CA (US); Niloy Mukherjee, San Ramon, CA (US)

(73) Assignee: Eugenus, Inc., San Jose, CA (US)

( * ) Notice: Subject to any disclaimer, the term of this patent is extended or adjusted under 35 U.S.C. 154(b) by 386 days.

(21) Appl. No.: 16/661,759

(22) Filed: Oct. 23, 2019

(65) Prior Publication Data

US 2021/0125849 A1   Apr. 29, 2021

(51) Int. Cl.
*H01L 21/68* (2006.01)
*H01L 21/67* (2006.01)
(Continued)

(52) U.S. Cl.
CPC .. *H01L 21/67265* (2013.01); *H01L 21/67706* (2013.01); *H01L 21/681* (2013.01); *H01L 21/68707* (2013.01)

(58) Field of Classification Search
None
See application file for complete search history.

(56) References Cited

U.S. PATENT DOCUMENTS

| | | | |
|---|---|---|---|
| 6,405,101 B1 | 6/2002 | Johanson et al. | |
| 6,934,606 B1 * | 8/2005 | Genetti | H01L 21/67201 118/712 |
| 2014/0072774 A1 * | 3/2014 | Kito | H01L 21/67288 428/174 |

FOREIGN PATENT DOCUMENTS

| | | |
|---|---|---|
| JP | 5357694 B2 * | 12/2013 |
| JP | 5357694 B2 | 12/2013 |

(Continued)

OTHER PUBLICATIONS

International Search Report and Written Opinion dated Dec. 29, 2020 in Application No. PCT/US2020/050630.

*Primary Examiner* — Gerald McClain
(74) *Attorney, Agent, or Firm* — Knobbe, Martens, Olson & Bear, LLP

(57) ABSTRACT

The disclosed technology generally relates to semiconductor processing and more particularly to placing a substrate in a semiconductor manufacturing equipment for processing, and to apparatuses for placing the substrate in the semiconductor manufacturing equipment. In one aspect, a method of calibrating a process position of a semiconductor substrate in a process chamber comprises securing a calibration substrate on a susceptor in a processing chamber under an open chamber condition using a securing device, wherein securing comprises preventing the substrate from sliding laterally on the susceptor by more than a predefined tolerance from a centered position relative to a susceptor center. The method additionally comprises subjecting the calibration substrate under a process condition different from the open chamber condition. The method additionally comprises transferring the calibration substrate from the susceptor using a robot arm. The method further comprises detecting a position of the calibration substrate and recording coordinates of the robot arm corresponding to the detected position of the calibration substrate. Detection can be conducted on the fly. The securing device can be removed prior to processing substrates.

23 Claims, 12 Drawing Sheets

(51) Int. Cl.
  *H01L 21/677* (2006.01)
  *H01L 21/687* (2006.01)

(56) References Cited

FOREIGN PATENT DOCUMENTS

| | | | |
|---|---|---|---|
| JP | 5940342 B2 | 6/2016 | |
| JP | 2019-165242 A | 9/2019 | |
| JP | 2019165242 A * | 9/2019 | ....... H01L 21/68735 |
| KR | 10-1039441 B1 | 6/2011 | |
| KR | 10-2018-0070386 A | 6/2018 | |

* cited by examiner

SYSTEMS AND METHODS OF PLACING SUBSTRATES IN SEMICONDUCTOR MANUFACTURING EQUIPMENT

BACKGROUND

Field

The disclosed technology generally relates to semiconductor processing and more particularly to placing a substrate in semiconductor manufacturing equipment for processing, and to apparatuses for placing the substrate in the semiconductor manufacturing equipment.

Description of the Related Art

Some semiconductor processing equipment is configured to automatically move a semiconductor substrate, e.g., a semiconductor wafer, between different locations within the equipment using a substrate handling system. The substrate handling system may be configured to move a substrate between, e.g., a process chamber for processing the substrates, and a transfer chamber serving as a transfer hub between different chambers of the equipment. The substrate handling system may include an automated robot that moves the substrates between the different locations. Before semiconductor processing equipment is used for processing substrates, the automated robot may be calibrated such that different locations within the equipment can be mapped to avoid substrate breakages and to promote uniform processing. However, calibrating the robot to move the substrate between different locations within the processing equipment can be time consuming and/or introduce inaccuracies. Thus, there is a need for improved systems and methods for moving and placing semiconductor substrates in different locations within a semiconductor processing equipment with higher accuracy and/or reduced time.

SUMMARY

In an aspect, a method of calibrating a process position of a semiconductor substrate in a process chamber comprises securing a calibration substrate on a support, e.g., a susceptor, in a processing chamber under an open chamber condition using a securing device, wherein securing comprises restraining a lateral movement of the calibration substrate such that the calibration substrate remains within a predefined tolerance from a centered position relative to a center of the support. The method additionally comprises subjecting the calibration substrate to a process condition different from the open chamber condition. The method additionally comprises transferring the calibration substrate from the support using a robot arm. The method further comprises detecting a position of the calibration substrate and recording coordinates of the robot arm corresponding to the detected position of the calibration substrate.

In another aspect, a method of processing a semiconductor substrate in a process chamber comprises subjecting a calibration substrate to a process condition in a process chamber while being restrained on a support, e.g., a susceptor, within a predefined tolerance from a centered process position by a securing device. The method additionally comprises transferring the calibration substrate from the support using a robot arm and recording coordinates of the robot arm corresponding to a detected position of the calibration substrate along a substrate transfer path from the support. The method further comprises placing a semiconductor substrate, e.g., a production substrate, on the support to be processed at the process position using the recorded coordinates of the robot arm.

In another aspect, an apparatus for calibrating a process position of a semiconductor substrate in a semiconductor process chamber comprises a securing device configured to prevent a calibration substrate from sliding laterally on a support by more than 2 mm from a centered position relative to a support center. The calibration apparatus additionally comprises a sensor assembly configured to detect a position of the calibration substrate while the calibration substrate is transferred from the support using a robot arm. The calibration apparatus further comprises a memory device configured to record coordinates of the robot arm corresponding to the detected position of the calibration substrate.

In another aspect, a method of preparing a semiconductor processing equipment for processing a semiconductor substrate comprises providing a semiconductor processing equipment. The semiconductor processing equipment includes a process chamber comprising one or more processing stations each configured to process a substrate on a support, e.g., a susceptor, under a process condition. The semiconductor equipment additionally includes a transfer chamber connected to the process chamber, a robot configured to transfer the substrate between the process chamber and the transfer chamber, and a sensor assembly configured to sense a position of the substrate as the substrate is transferred between the process chamber and the transfer chamber. The method additionally comprises opening the process chamber and securing a calibration substrate at an open chamber centered position on the support such that the calibration substrate is prevented from sliding laterally on the support. The method additionally comprises closing the process chamber and subjecting the process chamber to the process condition. The method further comprises transferring the calibration substrate at the centered process position from the support to the transfer chamber using the robot and sensing a position of the calibration substrate using the sensor assembly.

BRIEF DESCRIPTION OF THE DRAWINGS

Embodiments of this disclosure will now be described, by way of non-limiting example, with reference to the accompanying drawings.

DETAILED DESCRIPTION

Figure 1A:
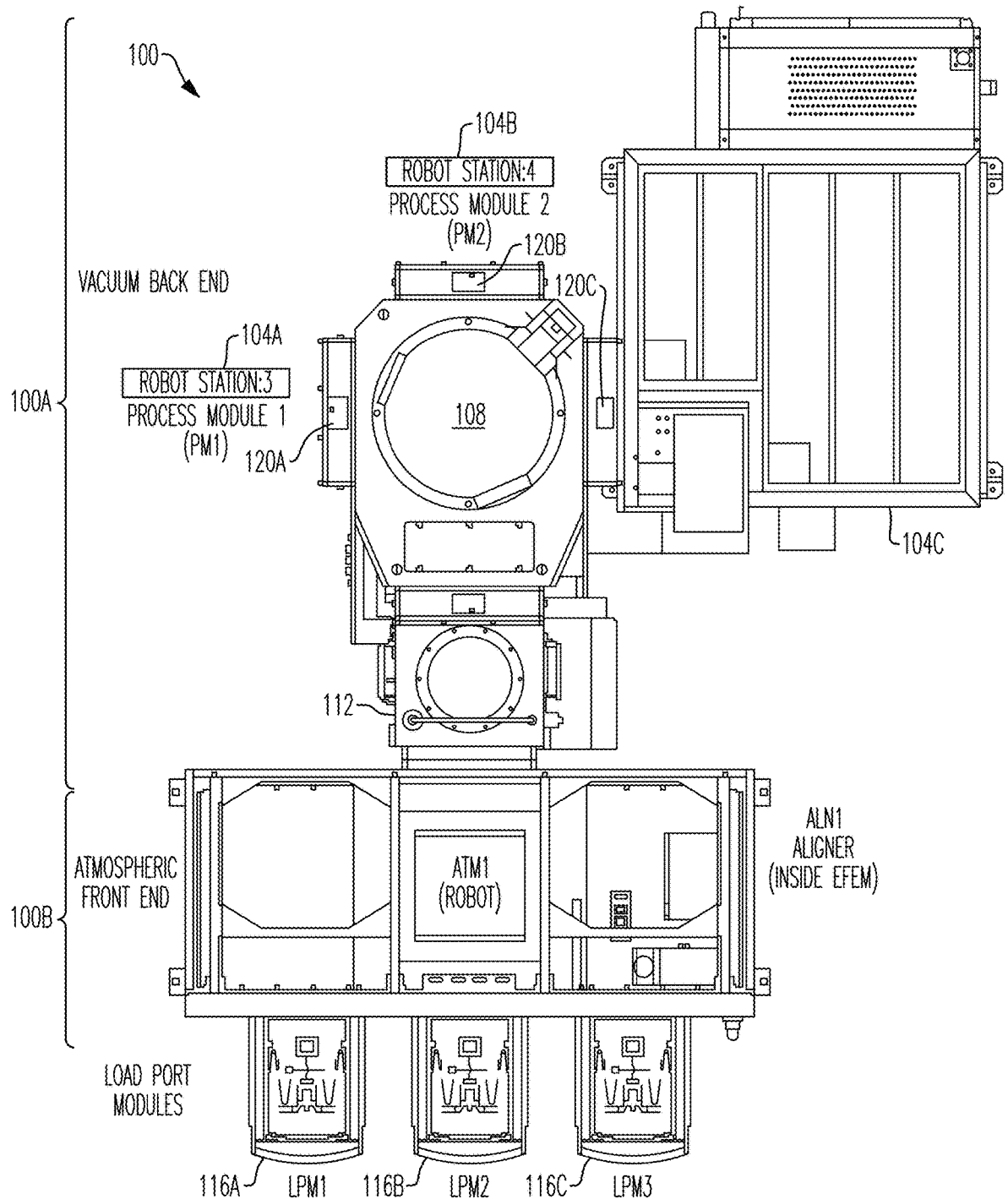
FIG. 1A is a top down view of example semiconductor processing equipment having a substrate handling system configured for moving and placing a semiconductor substrate at different locations within the semiconductor processing equipment, according to embodiments.

Processing conditions within a processing module of a semiconductor processing equipment can vary due to a variety of factors, e.g., temperature, gas flows, pressure, and plasma uniformity, to name a few. To promote uniform processing across a semiconductor substrate, an automatic wafer handling system may be configured to place the semiconductor substrate at a specific location in the processing chamber. For example, a substrate may be centered within a processing region of a susceptor, in which the substrate may be subjected relatively uniformly to the various processing conditions, such as heat, gas flows, pressure and plasma uniformity, to name a few. However, a substrate that is decentered within the processing region may be subjected relatively non-uniformly to the various processing conditions. The non-uniform processing conditions may lead to various nonuniformities. The nonuniformities may include thickness and/or composition nonuniformities of a deposited film in a deposition chamber or rate or profile nonuniformities of a patterned topography in an etch chamber, to name a few examples.

To place the substrates repeatably in the processing region on a susceptor, a robot may be employed in a semiconductor processing equipment. The robot may have an arm and a paddle or an end-effector disposed at an end thereof for transferring the semiconductor substrate between various locations within the semiconductor processing equipment. The robot may be calibrated or taught to recognize different locations of the semiconductor substrate within equipment, such that the substrate can be transferred between the different locations, e.g., chambers, within the equipment without breaking or damaging the substrate, and that the substrate can be disposed at specific locations, e.g., calibrated locations, within a given process chamber. For example, the robot may be calibrated to automatically perform its wafer handling tasks by calibrating the coordinates of a robot arm corresponding to various locations within the manufacturing equipment, such as process chambers, transfer chambers and load locks. After being calibrated, the robot may perform various functions associated with transferring the semiconductor substrate to various destinations including, e.g., determining the present location of the semiconductor substrate and the corresponding coordinates of the arm, reading various sensors and encoders, recalling from its storage or memory stored coordinates of the arm corresponding to the destination locations, and moving the substrate along a calculated path onto the destination location. However, as different parts of the processing equipment shift in position over time during usage and/or maintenance, the robot may need to be recalibrated or retaught. Such recalibration can be time consuming, which can contribute to prolonged equipment downtime and decreased productivity. Furthermore, the calibration of the robot is performed under conditions that may be different from processing conditions, which may limit the accuracy.

To address these and other needs, disclosed herein are methods of moving a substrate between different locations in the semiconductor processing equipment, and more particularly a method directed to promoting the consistency of placement of semiconductor substrates on a susceptor at an optimized processing position in a processing chamber. By way of example and without limitation, the disclosed method may be performed on a semiconductor processing tool such as the semiconductor processing equipment illustrated with respect to FIGS. 1A-1C. FIG. 1A is a top down view of an example semiconductor processing equipment 100 having a system configured for moving and placing a semiconductor substrate at different locations within the semiconductor processing equipment, according to embodiments. The semiconductor processing equipment 100 includes a backend module 100A, which may be under vacuum in operation, and an equipment frontend module (EFEM) 100B, which may be at atmospheric pressure.

Still referring to FIG. 1A, the backend module 100A includes a transfer chamber 108, which can be connected to one or more processing modules or chambers 104A, 104B, 104C. In the illustrated semiconductor processing equipment 100, the transfer chamber 108 is configured such that up to three processing modules or chambers can be connected thereto, including a first processing module (PM1) 104A, a second processing module (PM2) 104B and a third processing module (PM3) 104C. For clarity, in the illustrated semiconductor processing equipment 100, only the third processing module 104C is shown, and first and second processing modules 104A, 104B are only schematically indicated adjacent their respective gate valves. The processing modules or chambers 104A-104C can be the same type or different types, and can be configured to perform one of various processes, e.g., single wafer processes, used in fabricating an integrated circuit (IC) device, including depositing, coating, etching, cleaning, ashing or annealing, to name a few example processes. When the processing module or chamber is a deposition module, the deposition module can be configured to deposit a thin film by physical vapor deposition, chemical vapor deposition or atomic layer deposition, to name a few examples. Each of the processing modules or chambers can in turn comprise one or more processing stations each configured to process a substrate under a process condition, including a process temperature and a process pressure. The processing stations can be, e.g., single substrate processing stations each configured to process a single substrate and can include a susceptor for processing the substrate thereon. The semiconductor equipment additionally includes one or more load locks 112. Each of the load locks 112 may have a plurality of slots for holding a plurality of semiconductor substrates, e.g., in a vertically stacked configuration. In some configurations, two or more load locks 112 may be vertically stacked relative to each other. However, in some other configurations, the load locks 112 may be laterally disposed with respect to each other. As configured, the transfer chamber 108 serves as a hub for transporting semiconductor substrates between the processing modules or chambers 104A-104C and the load locks 112.

Still referring to FIG. 1A, disposed in transfer paths of a semiconductor substrate between the transfer chamber 108 and the process modules or chambers 104A, 104B and 104C are sensor assemblies 120A, 120B and 120C, respectively. The sensor assemblies 120A-120C may include, e.g., optical sensor assemblies for detecting when a substrate passes through a detection region. Each of the optical sensor assemblies may, for example, include a light emitter and a light detector such that an edge of a substrate may be detected as it passes through and blocks or interrupts a beam path between the light emitter and the light detector. In the illustrated embodiment, the sensor assemblies 120A-120C are located at regions near the gate valves separating the transfer chamber 108 from the process chambers 104A-104B, but in other arrangements the sensor assemblies can be located in other regions accessible to the transfer robot.

Figure 1B:
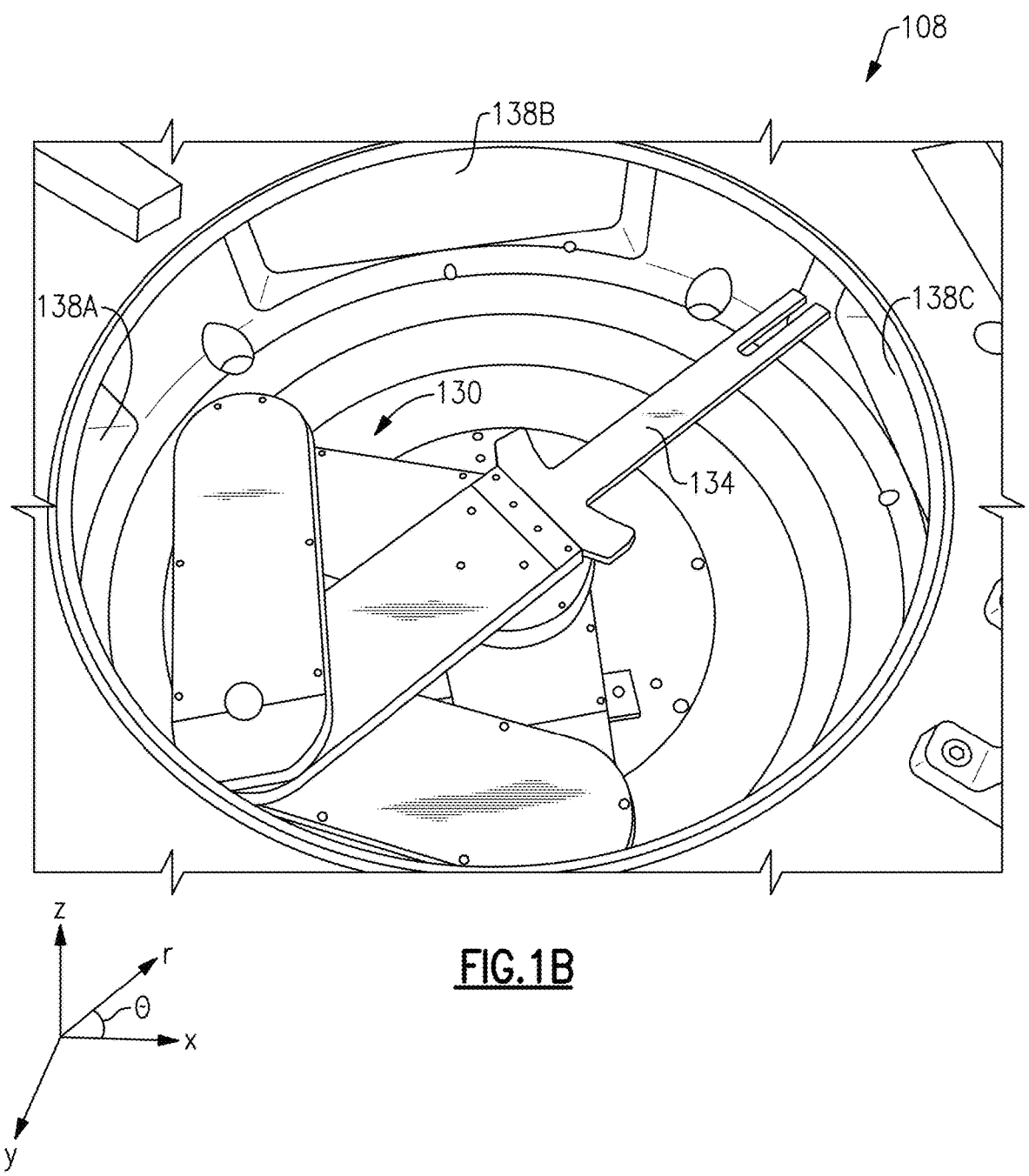
FIG. 1B is a perspective view of an open transfer chamber of the semiconductor processing equipment illustrated in FIG. 1A showing an example vacuum transfer robot having an arm that can rotate, move vertically and extend laterally to move a semiconductor substrate between different locations of the semiconductor processing equipment.

While not shown in FIG. 1A due to the transfer chamber 108 having a closed lid, installed inside the transfer chamber 108 is a vacuum transfer robot, which is described further herein. FIG. 1B is a perspective view of an open transfer chamber 108. The transfer chamber 108 includes a vacuum transfer robot (VTR) 130, which is controlled by a VTR controller (not shown) and configured to transfer a substrate between different locations in in the backend module 100A of the semiconductor processing equipment 100. The arm of the VTR 130 has motional degrees of freedom in rotational (θ), radial (r), and vertical (z) axes of motion. The VTR 130 may have one or more sets of arms each having an end effector 134 or a paddle having a fork-shaped end for placing and holding a semiconductor substrate thereon. Thus, a given position of the arm of the VTR 130 may have corresponding coordinates, which can be defined by radial (θ, r, z) or Cartesian (x, y, z) coordinates. The coordinates may be defined relative to an origin. By way of example, an origin (0, 0, 0) may correspond to the coordinates of the robot arm in a fully lowered and retracted state with the end effector 134 facing directly at the PM2 104B. The illustrated transfer chamber 108 additionally includes slot valves 138A, 138B and 138C for isolating the process modules 104A-104C, respectively, from the transfer chamber 108 during processing. The transfer chamber 108 additionally includes a slot valve (not) shown for isolating the transfer chamber 108 from the load lock(s) 112. The robot arm according to various embodiments may be any suitable type so long as it can translate with the degrees of freedom described herein, including a selective compliance assembly robot arm (SCARA) type or a closed kinematic chain ("frog leg") type.

Figure 1C:
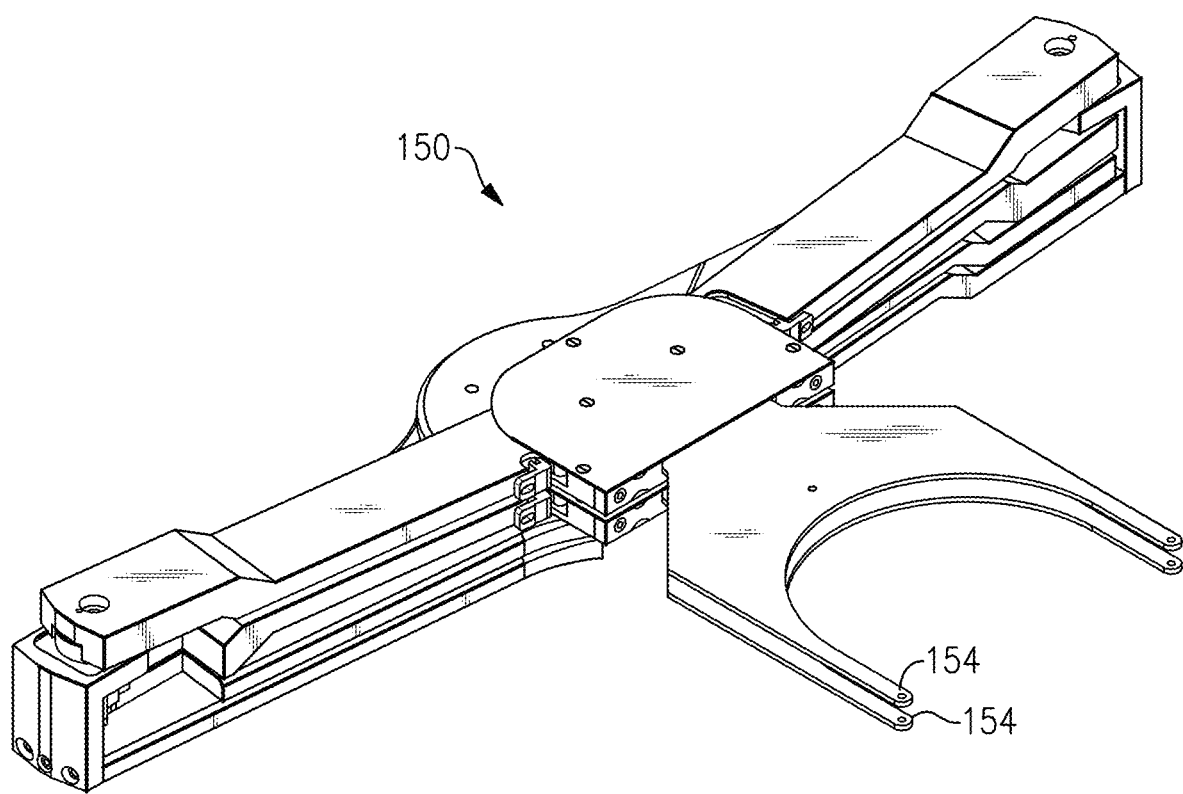
FIG. 1C is a perspective view of another example vacuum transfer robot that can be installed in the transfer chamber of the semiconductor processing equipment illustrated in FIG. 1A.

FIG. 1C is a detailed perspective view of a VTR 150 that can rotate and extend to move a semiconductor substrate between different locations, according to embodiments. In the illustrated example, the arms have a "frog leg" configuration for extending in radial directions. The illustrated VTR 150 has two sets of arms, each of which may extend independently while rotating dependently in an over-under formation with one end effector 154 over the other. In operation, one end effector 154 may extend as the other end effector 154 retracts, such that throughput may be increased. It will be appreciated that the VTR 130 (FIG. 1B) and VTR 150 are provided herein as examples and other variations of VTRs are possible.

Referring back to FIG. 1A, connected to the load locks 112 is the equipment frontend module (EFEM) 100B of the semiconductor processing equipment 100 under an atmospheric pressure, and one or more load port modules 116A, 116B, 116C connected thereto. The load port modules 116A-116C collectively serve as an interface for introducing semiconductor substrates into the semiconductor processing equipment 100, either manually or through automated means, e.g., automatic material handling system (AMHS) vehicles. The EFEM 100B may be under a minienvironment equipped to provide laminar airflow and filtering to maintain a low particle environment (e.g., a class 1 environment). The EFEM 100B includes various components, including an aligner ALN1 and an atmospheric robot ATM1. An aligner may be configured to align fiducials or notches of the semiconductor substrates. The atmospheric robot configured to move the semiconductor substrates between load port modules 116A-116C and the EFEM 100B. As configured, the load lock(s) 112 are transition chambers that serve as a hub for transferring substrates between the transfer chamber 108, which is under vacuum, and the rest of the factory including the load port modules 116A-116C, which is under an atmospheric pressure.

Referring still to FIG. 1A, in operation, a substrate, which may have one or more prior processing steps performed thereon, may be loaded onto one of the load port modules 116A-116C. The atmospheric robot ATM1 moves the semiconductor substrate from one of the load port modules 116A-116C into one of the load locks 112. After the semiconductor substrate is placed in one of the load locks 112 and the outer door to the EFEM 100B sealed, the pressure within the load locks 112 may be equalized with that of transfer chamber 108 and the inner door opened. Subsequently, the VTR 130 (FIG. 1B) rotates the end effector 134 (FIG. 1B) towards the load locks 112 to pick up and place thereon the semiconductor substrate. Once the semiconductor substrate is picked up from load lock 112 using the end effector 134, the VTR 130 (FIG. 1B) radially retracts the end effector 134 away from the load lock 112 and the arms rotate such that the end effector 134 is directed toward one of the slot valves 138A-138C (FIG. 1B) along a path which includes a processing position on a susceptor in a corresponding one of the process modules 104A-104C. The arms subsequently extend in the path through an open slot valve to place the substrate on the susceptor. As the semiconductor substrate moves in the path into one of the processing modules 104A-104C, the substrate passes over one of the sensor assemblies 120A-120C, thereby triggering a VTR controller to record corresponding coordinates of the VTR 130.

Figure 2A:
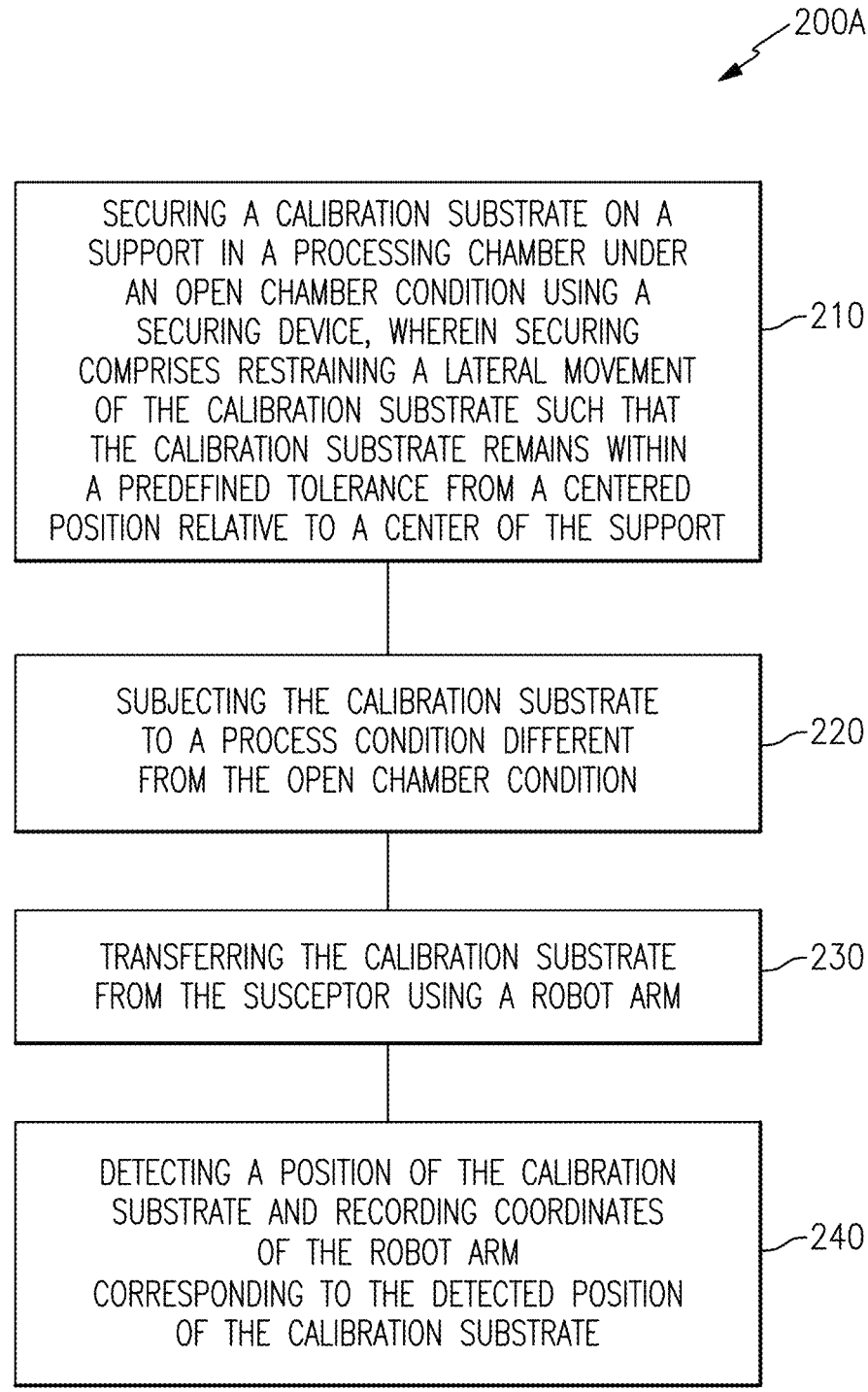
FIG. 2A is flow chart illustrating a method of calibrating a process position in a semiconductor process chamber, according to embodiments.

FIG. 2A is a flow chart illustrating a method 200 of preparing semiconductor processing equipment for processing a semiconductor substrate therein, e.g., calibrating a process position of a semiconductor substrate on a susceptor.

The method 200 may be performed on semiconductor processing equipment similar to that described above with respect to FIG. 1A-1C using a calibration substrate. The method 200 comprises opening a process chamber of a semiconductor processing equipment and securing 210 a calibration substrate on a susceptor in the processing chamber under an open chamber condition using a securing device. Securing, which may be performed manually, comprises restraining a lateral movement of the calibration substrate such that the calibration substrate remains within a predefined tolerance from a centered position relative to a center of the susceptor. The centered position may be a position centered relative to a center of the susceptor. The method additionally comprises closing the process chamber and subjecting 220 the calibration substrate under a process condition different from the open chamber condition. The process condition may include, e.g., an elevated process temperature and/or a process pressure under vacuum. The process condition may cause the calibration substrate on the susceptor to shift, e.g., due to a shift of various components in the processing chamber such as the susceptor itself, from the centered position under an open chamber condition to a centered process position under the process condition. That is, while a relative movement of the calibration substrate relative to the susceptor is restrained by the securing device, an absolute position of the calibration substrate may still change due to the processing chamber being placed under the process condition. The method additionally comprises transferring 230 the calibration substrate from the susceptor using a robot arm. The method further comprises detecting 240 a position of the calibration substrate while the calibration substrate is in transit from the susceptor and recording coordinates of the robot arm corresponding to the detected position of the calibration substrate.

Figure 2B:
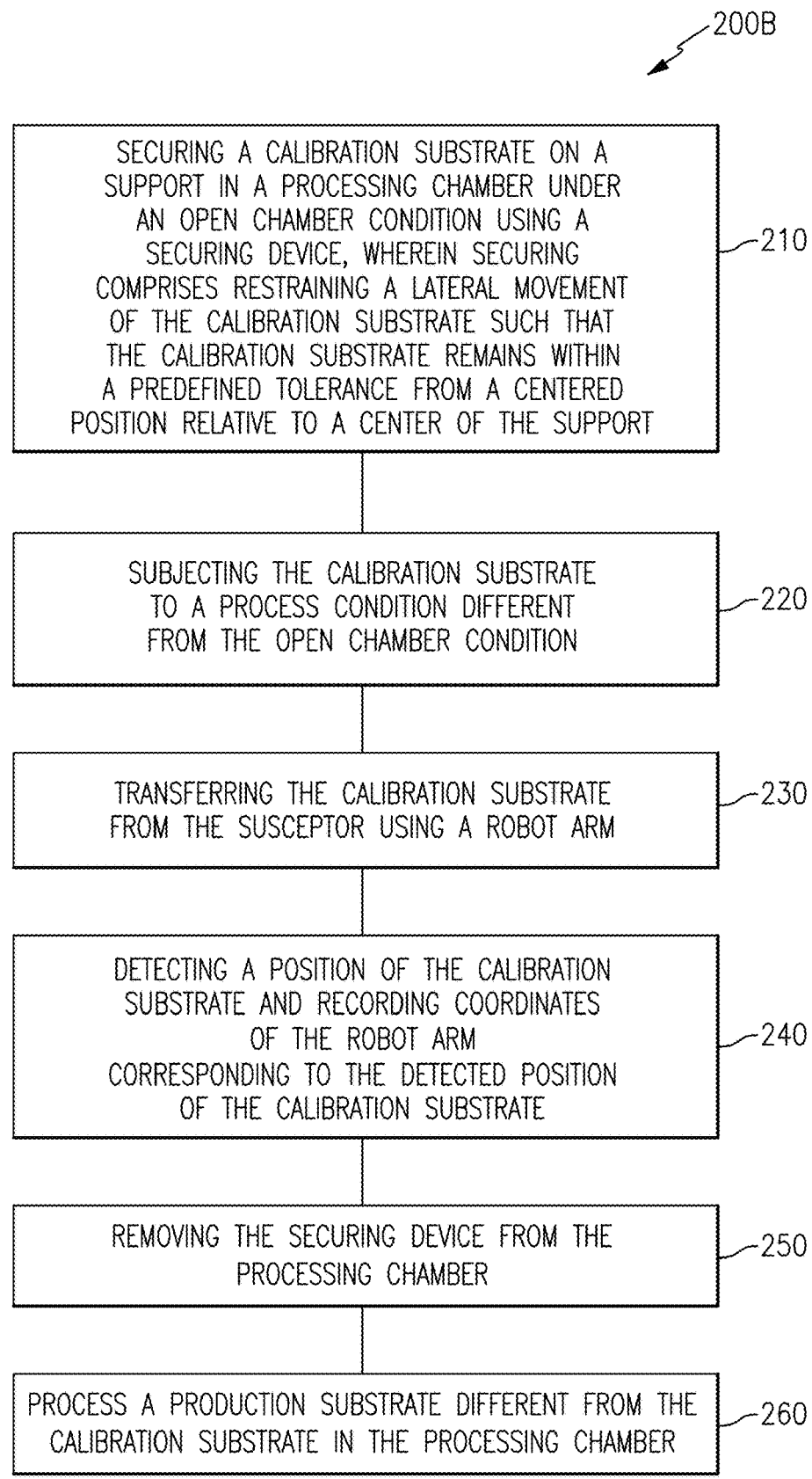
FIG. 2B is flow chart illustrating another method of calibrating a process position in a semiconductor process chamber, according to embodiments.

Referring to FIG. 2B, after calibrating using the calibration substrate as described above with respect to FIG. 2A, the semiconductor processing equipment may be used to process semiconductor substrates, e.g., manufacturing or production semiconductor substrates, at the calibrated centered process position, e.g., to manufacture IC devices. In some embodiments, the securing device may be removed from the process chamber prior to processing the production semiconductor substrates, such that the securing device is temporary. For example, because the securing device may be primarily be designed for calibration, it may have relatively small tolerance for off-centered placement of the production semiconductor substrates. The small tolerance may be too small for manufacturing throughput and may result in the production semiconductor substrates undesirably contacting the securing device. Such contact may be undesirable, as it may have some adverse effects, e.g., thermal or deposition nonuniformity, across the production semiconductor substrates during manufacturing if the securing remained in place during processing of the production semiconductor substrates, which is not of concern for the calibration substrate. However, in some other embodiments, the securing device may be left in the process chamber such that the production semiconductor substrates are processed therewith. Processing production semiconductor substrates includes placing a semiconductor substrate different from the calibration substrate to be processed on the susceptor at the centered process position using the recorded coordinates of the robot arm. Prior to placing the production semiconductor substrate on the susceptor, a position of the production semiconductor substrate may be detected and the robot arm may be adjusted based on the previously detected and/or recorded position of the calibration substrate, such that the production semiconductor substrate is placed on the susceptor at the process position.

Some existing methods of calibrating a process position, e.g., a centered process position, on a susceptor involve iterative cycles. Each cycle may include, e.g., placing the semiconductor substrate on the susceptor in a process chamber under vacuum using a robot, venting the process chamber to view the position of the semiconductor substrate on the susceptor, adjusting coordinates of robot arm corresponding to the process position such that the substrate is placed closer to a centered position on the susceptor, recording the corresponding coordinates of the robot arm, closing and evacuating the process chamber. The iterative cycles may be repeated until a satisfactory position of the semiconductor substrate on the susceptor is achieved based on, e.g., measurement of a processed monitor substrate. However, performing the iterative cycles may be time consuming, and the number of iterative cycles to achieve a satisfactory position of the semiconductor substrate can sometimes be high. When the process chamber is a multi-station process chamber including multiple processing stations and multiple susceptors (see, e.g., FIG. 8A below), the calibration process can be particularly difficult and time consuming. The difficulty in calibrating process positions in a multi-station process chamber arises in part due to the fact that a single robot may be used to place the substrate at different processing stations. As a result, adjusting the coordinates of the robot arm to center the substrate with respect to one of the susceptors can affect the process positions of other susceptors, e.g., move away from the centers of the other susceptors.

Furthermore, the existing methods may not take into account of various effects the processing conditions may have on the calibration of the process position. For example, the inventors have discovered that various components of the process chamber including the susceptor may shift significantly in position when the process chamber is subjected to actual process conditions after calibrating under an open chamber condition. The actual process conditions that may shift the process positions include, among other things, elevated and/or cyclic temperatures and pressure cycles, e.g., pump/purge cycles in atomic layer deposition (ALD) process, vibrations caused by movements within the chamber, different relative thermal expansion for different parts within the chamber, etc. As a result, adjusting and calibrating the robot based on an observed centered position of the semiconductor substrates under open chamber conditions, e.g., atmospheric and/or room temperature conditions, may not be representative of the actual process position, e.g., a centered process position, of the semiconductor substrate during processing.

In recognition of these and other challenges, the inventors have developed methods described herein including, e.g., opening the process chamber and securing a calibration substrate on the susceptor using a securing device and subjecting the calibration substrate to a process condition that includes one or more parameters of an actual process recipe. Subsequently, coordinates of the robot corresponding to a position of the calibration substrate in transit from the process position, at which the calibration substrate has been subjected to the actual process condition, is recorded. The calibration substrate may be at a process temperature at the time it is picked up for transfer. The methods according to embodiments lead to higher accuracy of the calibrated process position for subsequent processing. The methods can be applied in both process chambers having one processing station or multiple processing stations.

The improved accuracy of the calibrated process position is achieved using the methods described herein, among other reasons, by using a securing device. The securing device according to embodiments are configured to limit a lateral movement of the calibration substrate relative to the susceptor within a relatively small predefined tolerance relative to a centered position of the calibration substrate. Thus, detecting the process position using the secured calibration substrate leads to an accurate determination of the properly centered process position under actual processing condition, regardless of a shift in the susceptor position that may be caused by the changing environment in the process chamber. That is, the securing device according to embodiments are configured such that any shift or movement of the susceptor that may result from changing conditions in the process chamber, e.g., temperature or pressure cycles, correspondingly shifts the calibration substrate to remain centered relative to the susceptor, even if that centered position shifts relative to the origin and relative to the open chamber centered position. As a result, the calibration method according to embodiments disclosed herein advantageously compensates for error introduced in determining the robot coordinates under an open chamber condition.

The calibration substrate can have a suitable shape and size corresponding to the production semiconductor substrates processed by the processing equipment, e.g., a circular shape having a 12 inch diameter, 8 inch diameter, 6 inch diameter, 4 inch diameter, etc. However, the calibration substrate need not be circular. The calibration substrate has the same size and shape as the production semiconductor substrates that are subsequently processed in the processing chamber. The calibration substrate can be formed of the same material as the production semiconductor substrates processed by the semiconductor processing equipment. For example, the calibration substrate may be a silicon test wafer. However, the calibration substrate can be formed of a different material from the production semiconductor substrates processed by the semiconductor processing equipment. For example, the calibration substrate can be formed of a different material such as graphite or a ceramic material. The calibration substrate formed of a different material can be less light-reflective compared to Si wafers, which may be advantageous for use in conjunction with optical sensors based on visible light.

Figure 3A:
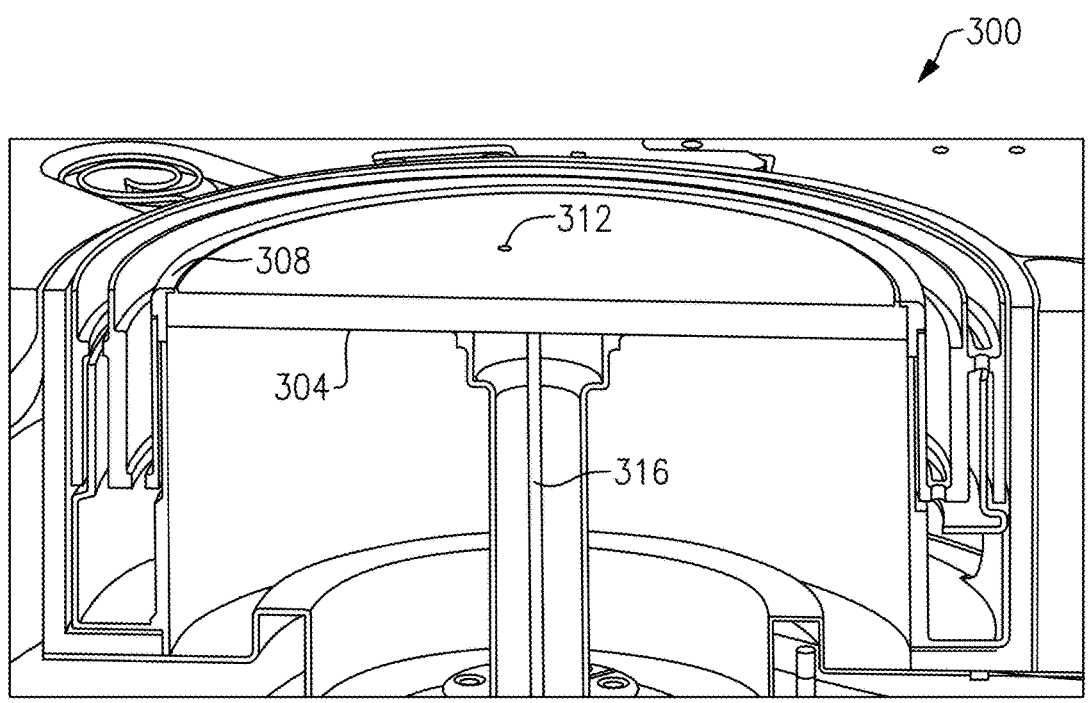
FIG. 3A is a cross-sectional perspective view of an example susceptor assembly that may be used in conjunction with a securing device for securing a semiconductor substrate to a susceptor, according to embodiments.

An example of a securing device is described herein with respect to FIGS. 3A-3D. FIG. 3A is a cross-sectional perspective view of a susceptor assembly 300 that may be used in conjunction with a securing device for securing a semiconductor substrate to a substrate support, such as a susceptor, according to embodiments. The susceptor assembly 300 includes a support in the form of a susceptor 304 having a circular upper surface configured to hold a semiconductor substrate thereon during processing. The susceptor 304 can be made of a material which absorbs energy by various means, including induction, conduction, and/or radiation and can heat or cool the semiconductor substrate. In other embodiments, the support can be an internally wafer chuck. The susceptor 304 may be formed of a suitable material with high thermal shock resistance, thermal conductivity and purity for processing at elevated temperatures. For example, the susceptor 304 may be formed of a material such as silicon carbide (SiC), SiC-coated graphite, and silicon, depending on the specific thermal and chemical environment, as well as specifications of thermal stability, corrosion resistance and durability. The susceptor assembly 300 has a central conduit 316 through which electrical connections can be made for providing, e.g., power or sensing signals to or from the susceptor 304. The susceptor assembly 300 includes three or more pins 312 that are configured to move up and down during the transfer of the substrate to and from the susceptor 304. During processing, the top surface of the pins 312 are flush or below the surface of the susceptor. Prior to transferring the substrate to and from the susceptor 304, the pins 312 are placed on a high position relative to the susceptor 304 surface, such that an end effector can be inserted between the substrate and the upper surface of the susceptor 304. The pins 312 are then moved downwards relative to the susceptor 304 surface such that the substrate rests on the end effector so that the substrate can be transferred out of the processing chamber. Also illustrated in FIG. 3A is a securing device 308 configured to secure the substrate, e.g., a calibration substrate, to a processing position, e.g., a centered processing position, on the susceptor 304 during the performance of various methods described herein. Because the securing device 308 can be a temporary device for use during calibration but not necessarily during processing, the securing device 308 can be configured to be readily inserted and removed in the processing chamber with minimal effort or disturbance to the positions of surrounding features.

Figure 3B:
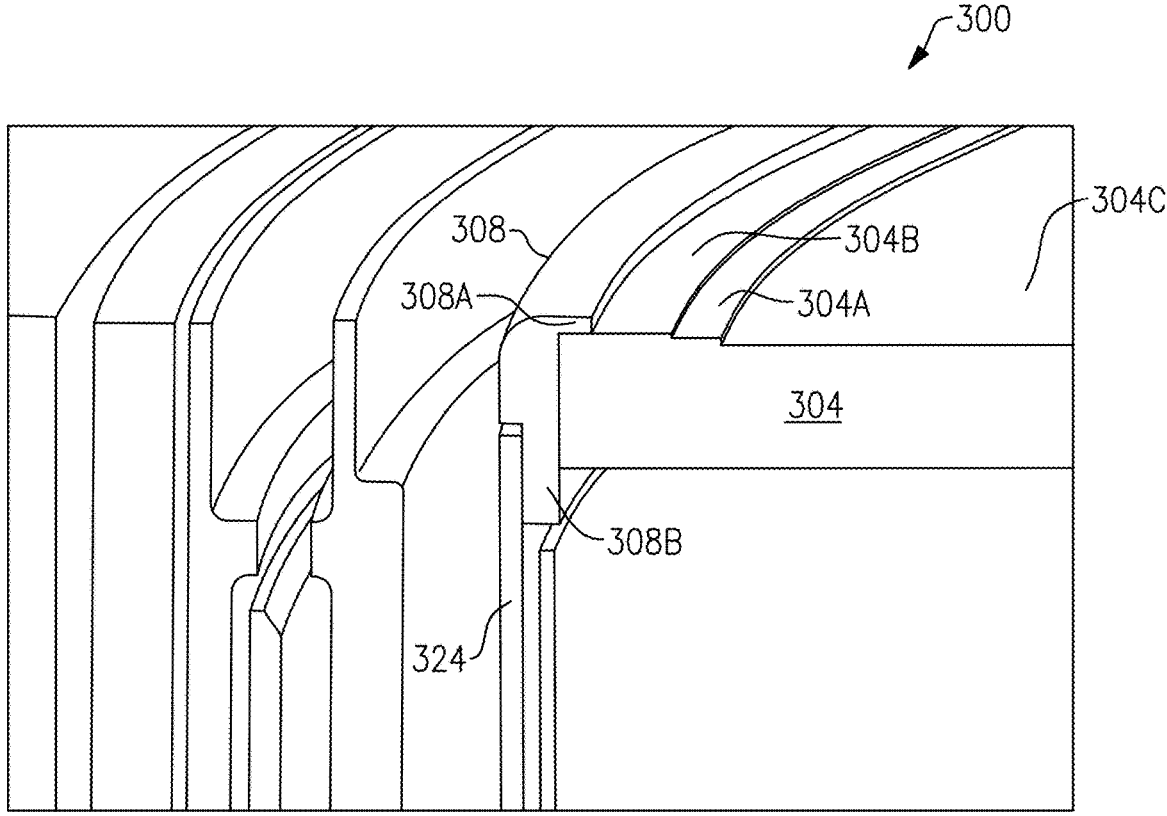
FIG. 3B is a detailed cross-sectional perspective view of a portion of the example susceptor assembly illustrated in FIG. 3A, according to embodiments.
Figure 3C:
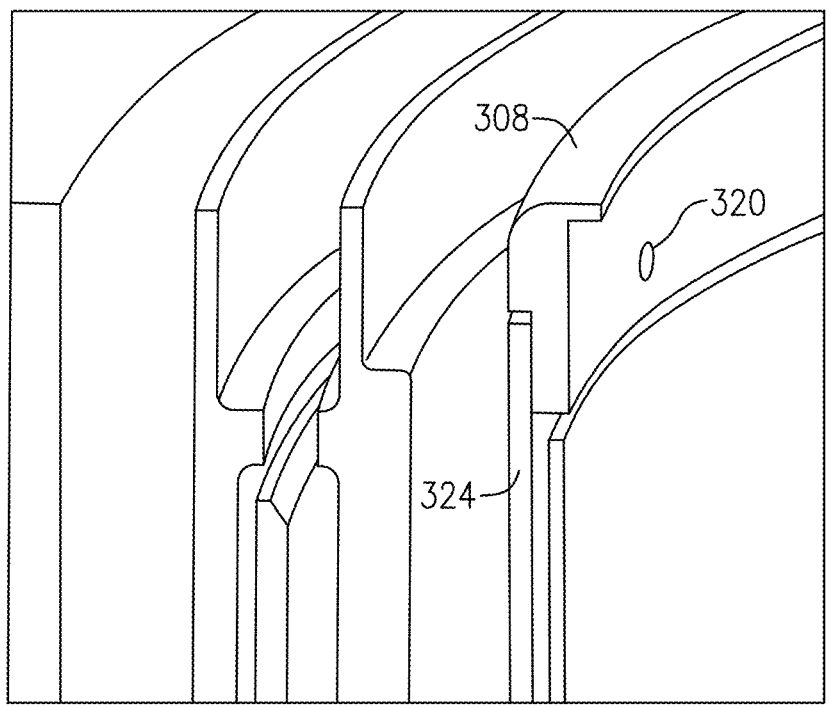
FIG. 3C is a detailed cross-sectional perspective view of a portion of the example susceptor assembly illustrated in FIG. 3A shown without the susceptor for purposes of illustration, according to embodiments.

FIG. 3B is a detailed cross-sectional perspective view of an edge region of the susceptor assembly 300 described above with respect to FIG. 3A. FIG. 3C is a detailed cross-sectional perspective view showing the edge region shown in FIG. 3B without the susceptor 304, to show the securing device 308 more clearly. As shown in FIG. 3B, in some configurations, the upper surface of the susceptor 304 includes one or more concentric shoulders 304A, 304B that form radial stepped surfaces that are raised surfaces relative to the a central surface 304C. When present, the edge regions of a substrate may contact the raised surface of the outer shoulder 304A or 304B. In the illustrated example, the securing device 308 has a ring structure, e.g., a collar structure having a horizontal portion 308A and a vertical portion 308B that are arranged as an inverted L shape in a cross sectional view. As shown in FIGS. 3B and 3C, the vertical portion 308B of the securing device 308 surrounds the susceptor 304 and the horizontal portion 308A extends radially inward towards the central surface 304C. The vertical portion 308B is horizontally interposed between the susceptor 304 and an outer cylindrical support structure 324. The horizontal portion 308A has an inner diameter that is smaller than that of the susceptor 304 such that it may rest on an outer edge region of the susceptor 304, e.g., the upper surface of the outer shoulder 304B of the susceptor 304. The horizontal portion 308A may be configured, e.g., to have a suitable thickness, such that an outer edge of a sliding semiconductor substrate may come in contact therewith extending beyond it. For example, the upper surface of the horizontal portion 308A may be designed to be higher than the upper surface of the semiconductor substrate by at least 0.5 mm, 1 mm, 2 mm, 3 mm, 4 mm, 5 mm, or any value in a range defined by any of these values. The position of the securing device 308 may be fixed using a screw 320 to fixedly attach the securing device 308 to the outer cylindrical support 324 structure of the susceptor assembly 300.

Figure 3D:
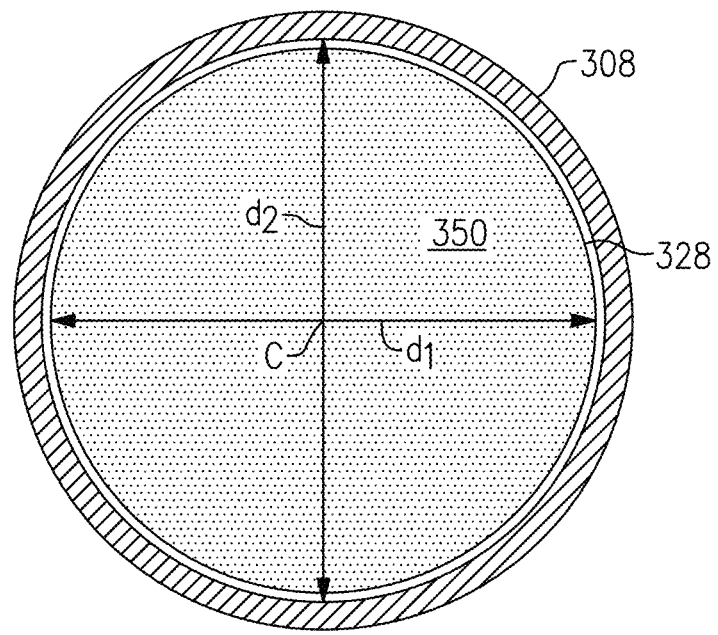
FIG. 3D is a top-down view of a securing device surrounding a semiconductor substrate on a susceptor, according to embodiments.

FIG. 3D is a top down view of a substrate 350 placed on a susceptor 304 described above with respect to FIGS. 3A-3C, and the securing device 308 surrounding the substrate 350. The horizontal portion 308A of the securing device 308 has an inner diameter $d_2$ that is greater than the diameter $d_1$ of the substrate 350 by a relatively small amount such that a small gap 328 defining a sliding tolerance is formed between the substrate 350 and the horizontal portion 308A of the securing device 308. On the one hand, the diameters $d_1$ and $d_2$ are close enough to each other such that the substrate 350 placed on the susceptor 304 is allowed to deviate within a small tolerance relative to a centered position on the susceptor 304. On the other hand, the diameters $d_1$ and $d_2$ are different enough from each other such that, once the robot arm coordinates corresponding to the centered position of the substrate 350 is determined according to embodiments, the substrate 350 can be repeatably placed on the susceptor 304 within the inner diameter of the securing device 308, taking into account of variabilities associated with robot accuracy, thermal expansions of the semiconductor substrate 350, the susceptor 304 and the securing device 308, and the variability of the position of the semiconductor substrate on the end effector. According to various embodiments, the difference $d_2-d_1$ or a maximum value of the gap 328 may be, e.g., less than 5 mm, 4 mm, 3 mm, 2 mm, 1 mm, 0.5 mm, or a value in a range defined by any of these values. Referring back to FIG. 3B, the susceptor may have a diameter that is between inner and outer diameters of the securing device 308.

The securing device 308 may be formed of a suitable material that takes into account some or all of the material properties associated with the susceptor 304, e.g., relatively matched thermal expansion as the semiconductor substrate, thermal stability, corrosion resistance, durability, purity and low particulate generation. For example, the securing device 308 may be formed of any suitable material that is the same or different from that of the susceptor 304, such as a material based on ceramic, glass, semiconductor or metal.

Other examples of a securing device are possible, so long as the above-described technical effects are substantially achieved. For example, while the securing device described above with respect to FIGS. 3A-3D is in the form of a collar ring, the securing device can take various other forms. For example, without limitation, the securing device may be a collar ring having a larger diameter with multiple protrusions, which may be detachable, extending inward to secure the semiconductor substrate at three or more points. The securing device may also be formed by discrete unconnected pieces that can be placed around a substrate to limit the lateral movement thereof.

In some embodiments, the calibration substrate may be disposed as shown in FIG. 3D manually. However, embodiments are not so limited and the calibration substrate may be disposed using the robot.

Referring back to the method 200A illustrated in FIG. 2A, after securing 210 the calibration substrate on the susceptor using a securing device described above with respect to FIGS. 3A-3D, the process chamber is closed and the calibration substrate is subjected 220 to a process condition. In some embodiments, subjecting 220 the calibration substrate to the process condition may include subjecting the substrate to one or both of a process pressure and a process temperature. A process pressure may be any pressure a semiconductor substrate may be subjected to in the process chamber during processing, including a base pressure prior to processing, a deposition pressure, an etch pressure or an anneal pressure, to name a few examples. For example, the process pressure may be any pressure less than an atmospheric pressure and greater than 0.01 mTorr. A process temperature may be any temperature a semiconductor substrate may be subjected to in the process chamber during processing, including a deposition temperature, an etch temperature or an anneal temperature, to name a few examples. For example, the process temperature may be any temperature between room temperature and less than 1500° C., e.g., 100-1500° C., 200-1500° C., 300-1500° C., 100-1000° C., 200-1000° C., 300-1000° C., or a temperature in a range defined by any of these values. In some embodiments, subjecting the calibration substrate to the process condition may include subjecting the substrate to at least a part of a process recipe including exposure to one or more gases such as precursors. Advantageously, subjecting the calibration substrate to the process condition allows the method to account for shifts in the position of the susceptor and/or the substrate as a result of the process condition.

Still referring back to FIG. 2A, after subjecting 220 the calibration substrate under a process condition, the method 200 proceeds to transferring 230 the calibration substrate out of the process chamber from the susceptor using the robot and detecting 240 the position of the calibration substrate. In some embodiments, detecting 240 is performed while the substrate is being transferred or in transit, e.g., while the calibration moving, and recording coordinates the robot corresponding to the detected position. According to some embodiments, the position of the calibration substrate is detected real-time while the substrate is moving using a sensor assembly described herein. However, embodiments are not so limited and as described herein, the terms "in transit" or "transferred" do not preclude methods in which the substrate is temporarily stopping and/or taken out of a direct path between the processing chamber and the transfer chamber to perform the detection. For example, the detection may be performed at a separate detection location, such as an alignment station.

Figure 4A:
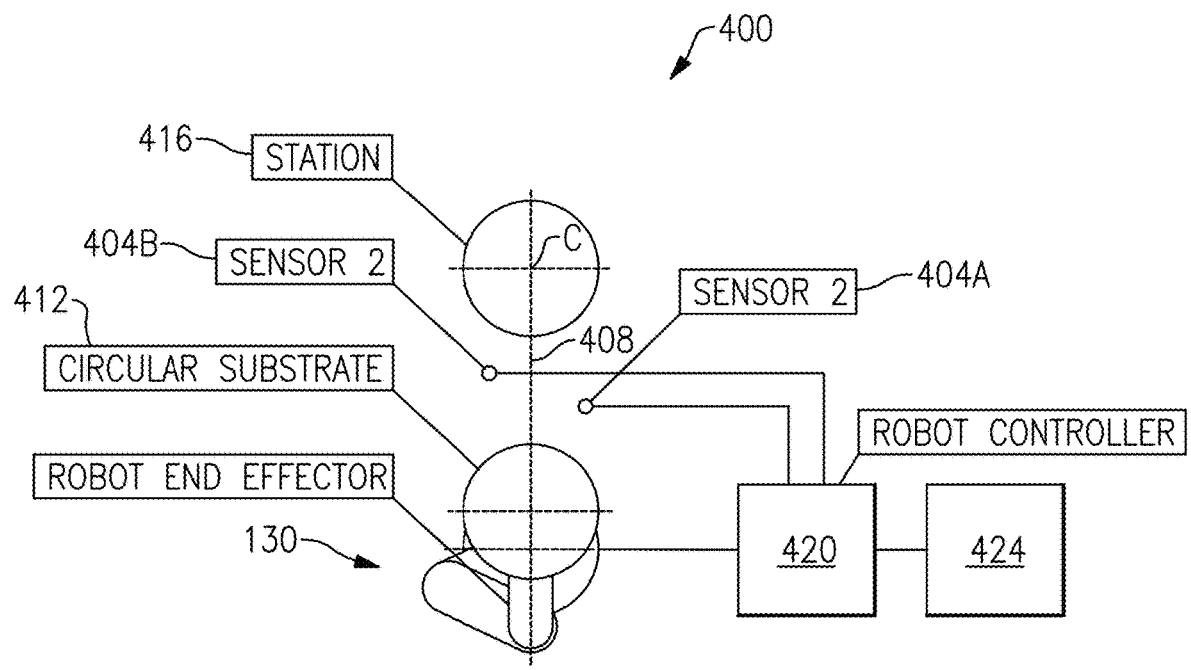
FIG. 4A schematically illustrates a sensor assembly configured to detect a position of a substrate passing over one or more sensors, according to embodiments.

FIG. 4A schematically illustrates a sensor assembly 400 for detecting a position, e.g., an edge, of a calibration or semiconductor substrate 412 as it passes through or over one or more sensors, e.g., optical sensors, and recording the robot coordinates corresponding to the detected position of the calibration or semiconductor substrate, according to embodiments. The sensor assembly 400 comprises one or more sensors 404A, 404B disposed in a path 408 of a calibration or semiconductor substrate 412, e.g., a path between a process chamber or a susceptor and a transfer chamber. The sensor assembly 400 is configured to detect a position of the substrate 412 having a suitable shape, e.g., a circular semiconductor wafer such as a 12 inch diameter wafer, 8 inch diameter wafer, 6 inch diameter wafer, a 4 inch diameter wafer, etc., as described above. However, the substrate 412 need not be circular. The substrate 412 can be a calibration substrate, an unprocessed semiconductor substrate or a semiconductor substrate having a partially fabricated integrated circuit thereon. The sensor assembly 400 may be disposed as described above with respect to sensor assemblies 120A-120C (FIG. 1A). For example, the sensors 404A, 404B may be disposed in the path 408 between the processing chamber or a processing station 416 of a processing chamber and an adjacent location within a semiconductor processing equipment. For example, as described above with respect to FIGS. 1A-1C, the sensors 404A, 404B may be configured to detect a substrate as it moves in the path 408 between the transfer chamber 108 (FIG. 1A) and one of the processing chambers or modules, e.g., the processing modules 104A-104C (FIG. 1A). The sensor assembly 400 is electrically connected to a vacuum transfer robot (VTR) controller 420, and configured to trigger and send an electrical signal to the VTR controller 420 when a position of the substrate 412 is detected. In response to the electrical signal, the VTR controller 420 is triggered to record a corresponding position or the coordinates of the VTR 130, e.g., radial and angular coordinates of the arm of the VTR 130 in a memory or storage device 424 electrically connected to the VTR controller 420.

Figure 4B:
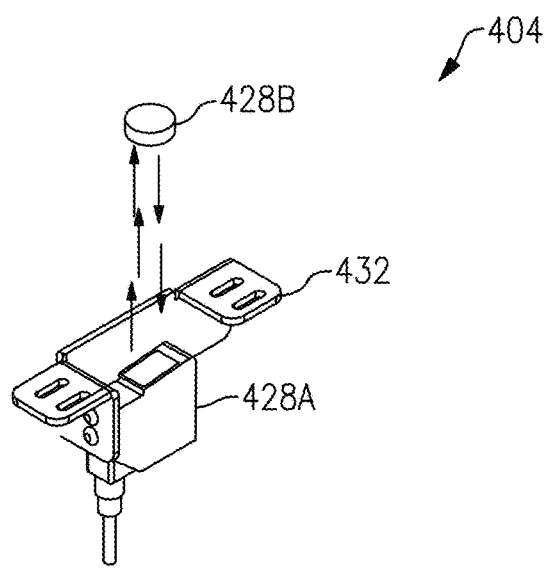
FIG. 4B is an example of an optical sensor configured to transmit a beam of light for detecting a position of a substrate passing therethrough, according to embodiments.

FIG. 4B illustrates an example of a sensor 404 that can be used as one or both of the sensors 404A, 404B. The sensor 404 includes a light source 428A and a detector 428B. The light source 428A can be a high speed laser, and the detector 428B can be a high speed sensor connected to the robot controller's digital I/O. The light source 428A and/or the detector 428B may be installed on the semiconductor processing equipment using, e.g., an installation bracket 432 such that the light beam is passed through transparent windows. In the illustrated example, the sensor 404 detects the position of the substrate 412 by detecting a blockage of the light beam as the substrate 412 (FIG. 4A) is transferred from the processing station 416 using the robot.

Figure 5:
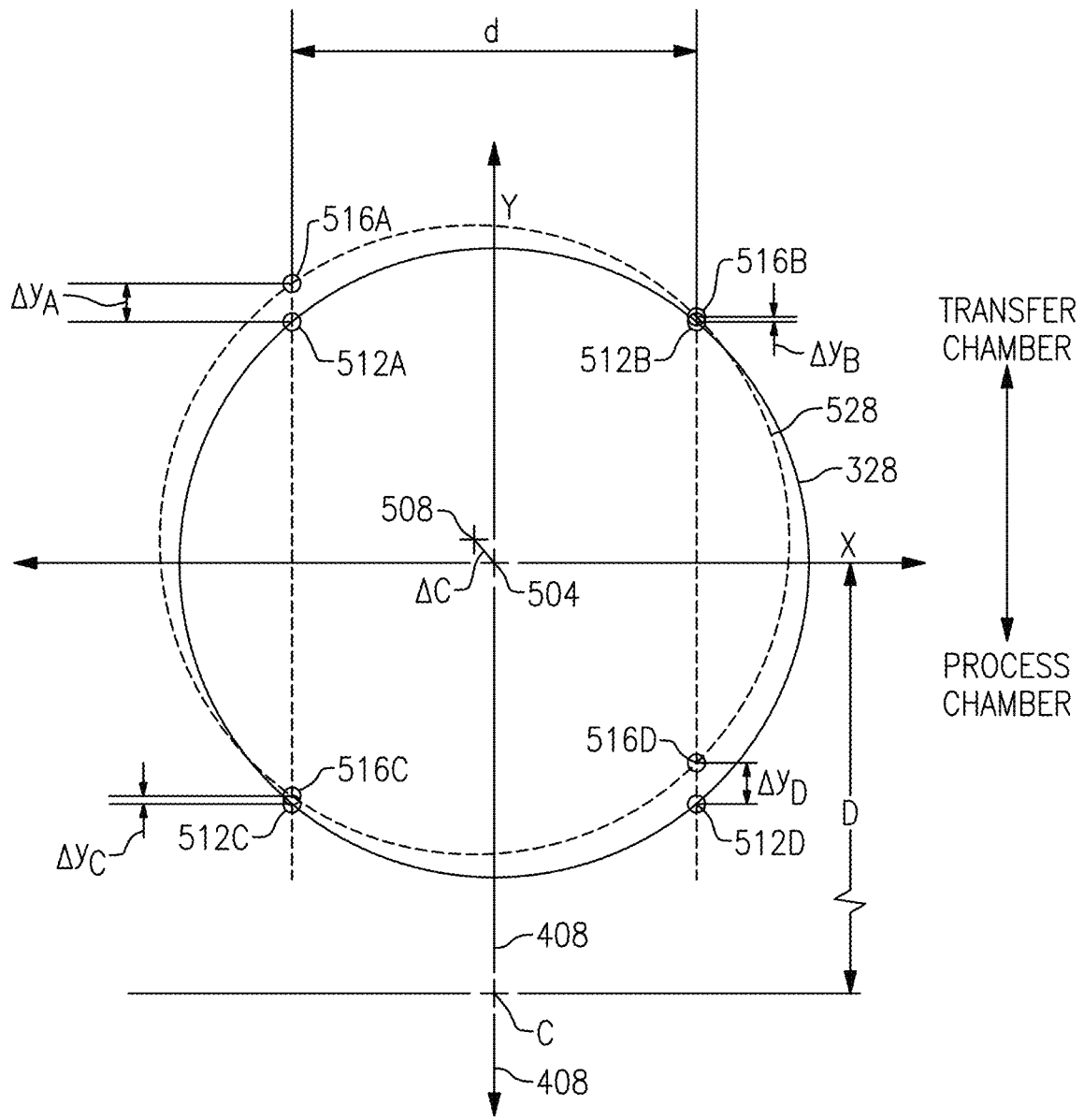
FIG. 5 illustrates edge regions of substrates that are detected by an optical sensor during transit between different locations of a semiconductor processing equipment, according to embodiments.

Referring to FIG. 5, an example method of detecting a position of a calibration substrate 328, e.g., while in transit from the susceptor, is described. Referring to FIG. 5, in a similar manner as described above with respect to FIGS. 3A-3D, the calibration substrate 328 is placed on the susceptor such that it is allowed to deviate within a small tolerance distance relative to a centered position. Thereafterwards, as described above with respect to FIG. 4A, the calibration substrate 328 is transferred out of the process station or chamber along a path 408, e.g., to a transfer chamber. The path 408 may represent, e.g., a line through a robot origin or reference point and the susceptor center C. As the calibration substrate 328 is transferred, its position is detected using one or more sensors such as the optical sensors based on light beams, as described above with respect to FIGS. 4A and 4B. For example, the detected position(s) may include, e.g., one or both of first and second leading substrate edge regions 512A and 512B as they cross a pair of beam paths of the optical sensors as described above. Alternatively or additionally, the detected position(s) may include one or both of first and second trailing substrate edge regions 512C and 512D as they cross the pair of beam paths. Based on known or measured values of a distance d between the pair of beam paths, the diameter of the circular calibration substrate 328, the velocity of the robot arm, measured crossing time(s) of the first and second beam paths by at least two of the first and second leading substrate edge regions 512A and 512B and the first and second trailing substrate edge regions 512C and 512C, and measured coordinates of the robot arm at the crossing time(s), a calibration center position 504 maybe determined or calculated by the robot controller, as well as the corresponding coordinates of the robot arm. Thus detected position of the calibration substrate and/or the corresponding coordinates of the robot arm are stored in a storage or memory connected to the robot controller as described above with respect to FIG. 4A.

Still referring to FIG. 5, after calibrating a centered process position in a process chamber using a calibration substrate 328 and storing the corresponding robot arm coordinates as described above, methods according to embodiments advantageously use the stored information as a reference to adjust positions of semiconductor substrates that are subsequently introduced into the process chamber for processing, as described herein. As described above, e.g., in reference to the method 200A illustrated in FIG. 2A, calibrating a centered process position according to various methods described herein reduces various sources of error associated with calibrating the centered process position including, e.g., temperature and pressure changes during processing relative to an open chamber condition. However, other sources of error exist, e.g., due to the variability of the substrate position as it enters the process chamber arising from movements or shifts of the substrate position in the load chamber, the transfer chamber and/or the end effector. Thus, to account for the various other sources of variability of the substrate position of a semiconductor substrate to be processed as it enters the process chamber, after calibrating the centered position using the calibration substrate 328 as described above, the methods according to embodiments further include transferring a production semiconductor substrate 528 to be processed into the process chamber, wherein while the production semiconductor substrate 528 is being transferred into the process chamber, a position of the production semiconductor substrate 528 is detected. The detected position of the production semiconductor substrate 528 may be adjusted such that the production semiconductor substrate 528 is placed on the susceptor for processing at or closer to the calibrated centered process position. The adjustment of the position of the production semiconductor substrate 528 to be processed can be real-time or "on the fly," e.g., as the semiconductor substrate is moving into the processing chamber from a transfer chamber. The adjustment may be triggered based on the position of the production semiconductor substrate 528 being detected using one or more sensors such as the optical sensors based on light beams, in a similar manner as described above with respect to the detection of the calibration substrate 328 (e.g., using sensors 404A, 404B in FIG. 4B), except that the direction of the motion of the production semiconductor substrate 528 is reversed. For example, the direction of the motion of the calibration substrate 328 during the calibration process described above may be from a process chamber to a transfer chamber, whereas the direction of the motion of the production semiconductor substrate 528 to be processed may be from the transfer chamber to the process chamber. For example, the detected position(s) of the semiconductor production substrate 528 may include, e.g., one or both of first and second leading substrate edge regions 516C and 516D as they cross the pair of beam paths of the optical sensors as described above. Alternatively or additionally, the detected position(s) may include, e.g., one or both of first and second trailing substrate edge regions 516A and 516B as they cross the pair of beam paths of the optical sensors in a similar manner as described above. Similar to as described above with respect to the detection of the calibration substrate 328, based on known or measured values of the distance d between the pair of beam paths, the diameter of a circular production semiconductor substrate 528, the velocity of robot arm, measured crossing time(s) of the first and second beam paths by at least two of the first and second leading substrate edge regions 516C and 516D and the first and second trailing substrate edge regions 516A and 516B and measured coordinates of the robot arm at the crossing time(s), an offset center position 508 maybe determined by the robot controller, as well as the corresponding coordinates of the robot arm. Upon a comparison of the position of the semiconductor production substrate 528, e.g., the offset center position 508, relative to the stored position of the calibration substrate 328, e.g., the calibration center position 504, or the corresponding coordinates of the robot arm, the robot arm may be adjusted to compensate for an offset therebetween. The comparison may utilize, e.g., the offsets in time or distance represented by the difference in the edge positions $\Delta y_A$, $\Delta y_B$, $\Delta y_C$, $\Delta y_D$, corresponding to differences between the edge positions 512A and 516A, 512B and 516B, 512C and 516C and 512D and 516D, respectively. For example, the robot may be controlled real time such that the position of the semiconductor production substrate 528 is adjusted to offset the difference between the recorded position of the calibration substrate 328 and the position of the production semiconductor substrate 528, which may be represented by a vector from the offset center position 508 to the calibration center position 504 having a magnitude ΔC, as shown.

Figure 6:
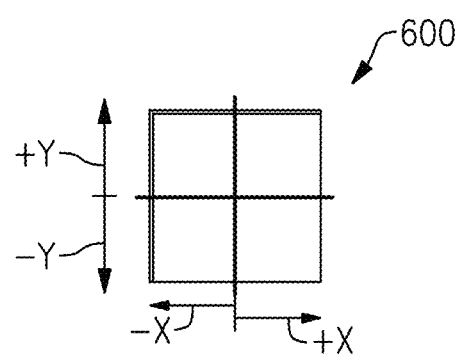
FIG. 6 illustrates an example threshold offset used for determining whether or not to adjust a position of a semiconductor substrate to be processed in a process chamber, according to embodiments.

FIG. 6 illustrates how a determination of whether or not the position of the production semiconductor substrate 528 is adjusted to offset the difference between the position of the production semiconductor substrate 528 relative to the stored position of the calibration substrate 328 may be made based whether the detected amount of the offset exceeds a threshold value. Such determination may be made using various methods. For example, referring to FIG. 6, the threshold value may be set based on a tolerance area 600 around the calibrated center position C (FIG. 5). In the illustrated example, the tolerance area 600 is defined by tolerances ±y in a first horizontal direction and tolerances ±x in a second horizontal direction. The tolerance values for making the adjustment in one or both horizontal directions may be, e.g., 0.02 mm, 0.05 mm, 0.1 mm, 0.15 mm, 0.2 mm or a value in a range defined by any of these values. For example, when the threshold tolerance is ±0.1 mm in the first horizontal direction and ±0.1 mm in the second horizontal direction, the tolerance area 600 has an area of 0.04 mm$^2$ centered around the calibration center position 504 (FIG. 5). When the detected offset centered position 508 (FIG. 5) is outside of the tolerance area 600, a corresponding adjustment of the robot may be triggered to offset the shift in the position of the production semiconductor substrate 528 (FIG. 5).

Figure 7:
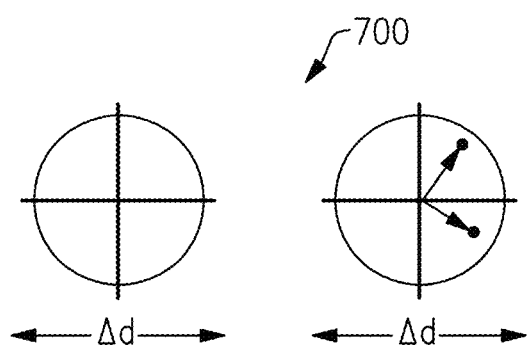
FIG. 7 illustrates another example threshold offset used for determining whether or not to adjust a position of a semiconductor substrate to be processed in a process chamber, according to embodiments.

Other examples of determining a threshold value are possible. For example, referring to FIG. 7, the threshold value may be set based on a tolerance area 700 around the calibrated center position in the form of a circular area having a diameter. In this approach, any detected shift that falls inside the circle is considered to be within specification, and an adjustment of the robot arm is not triggered. For example, the method may use a vector length from the recorded value of the calibrated center position 504 (FIG. 5) to determine whether an adjustment is triggered. In the illustrated example, the dots, which may represent measured offset center positions of semiconductor substrates to be processed, would be considered within the specification, and an adjustment would not be triggered. The tolerance value defined by the diameter Δd of the tolerance area may be, e.g., 0.04 mm, 0.1 mm, 0.2 mm, 0.3 mm, 0.4 mm, or a value in a range defined by any of these values. For example, when the diameter Δd is 0.2 mm, the tolerance area 700 has an area of 0.01π$^2$ mm$^2$ centered around the calibration center position 504 (FIG. 5). When the offset centered position 508 (FIG. 5) is outside of the tolerance area 700, a corresponding adjustment of the robot may be triggered to offset the shift in the position of the semiconductor substrate. Thus, determining whether or not to offset the position of the robot arm to place the semiconductor substrate closer to the calibration center position 504 (FIG. 5) may include, among other things, moving the robot arm such that the semiconductor substrate moves to cross the pair of light beams of the sensor pair, capturing the position of the semiconductor substrate and the corresponding position of the robot arm using the robot controller, and comparing the newly captured position to the stored calibration center position. If the newly measured position is outside of a predetermined threshold, an offsetting adjustment may be made as described above. If the newly measured position is inside of the predetermined threshold, the robot is allowed to continue to transfer the semiconductor substrate to the susceptor. As described above, while the sensor pair senses the semiconductor substrate on the end effector, the actual information stored and compared may be coordinates of the robot arm as the substrate passes though the beam of the sensors. Using an algorithm, the substrate offset may be calculated and the robot trajectory is then adjusted to position the substrate closer to the stored calibration center position on the susceptor.

According to embodiments, using the method, the repeatability of subsequent centered positions of the semiconductor substrates on the susceptor may be less than 500 μm, 400 μm, 300 μm, 200 μm, 100 μm, 50 μm, or a value in a range defined by any of these values, relative to the stored center position using the calibration substrate.

Figure 8A:
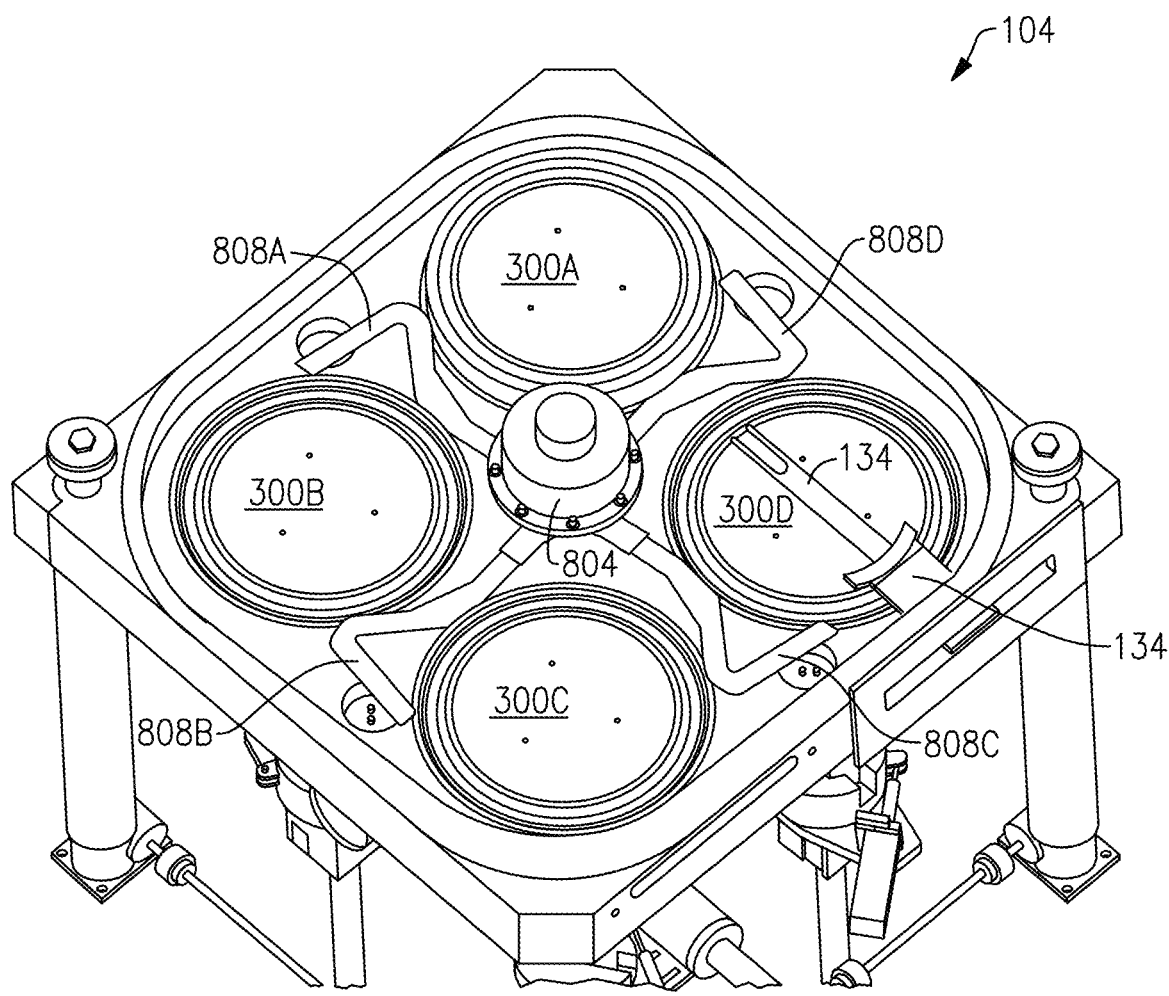
FIG. 8A is a perspective view of a process chamber having multiple processing stations that can employ various methods, according to embodiments.

In the above, calibrating the center process position in a process chamber and subsequently processing a semiconductor substrate based on the same have been described with reference to a single susceptor. However, the inventive concepts disclosed can be extended to a multi-station process chamber having a plurality processing stations each having of susceptor. An example of a process chamber 104 having a plurality of process stations is illustrated in FIG. 8A. For clarity, the chamber lid is not shown. The illustrated process chamber 104 can correspond, e.g., to any of the process modules or chambers 104A, 104B or 104C that can be attached to the transfer chamber 108, as described above with respect to FIG. 1A. In the illustrated embodiment, first to fourth process stations include first to fourth susceptors 300A, 300B, 300C and 300D, respectively. The illustrated process chamber 104 additionally includes an indexer 804 including first to fourth indexer arms 808A, 808B, 808C and 808D. The indexer 804 is illustrated in greater detail in FIG. 8B. The indexer 804 includes a central shaft from which the first to fourth indexer arms 808A-808D extend outward. The central shaft is configured to rotatingly translate the first to fourth indexer arms 808A-808D. Each of the indexer arms 808A-808D has a receiving end for receiving a substrate, and each of the receiving ends includes sets 812A, 812B, 812C and 812D of at least three pins, respectively. Unlike process chambers having a single susceptor in which a robot end effector may transfer a substrate directly to and from a susceptor, in the illustrated process chamber 104 having multiple processing stations, one or more substrates are first transferred to the receiving ends of one or more arms 808A-808D of the indexer 804 before being picked up by the end effector 134 of the robot or being placed on the susceptor(s). The receiving ends of indexer arms 808A, 808B, 808C and 808D are configured to receive a substrate serially from an end effector 134 (FIG. 8A), which may enter the chamber through a single slot valve (138A-138C in FIG. 1B).

Figure 8B:
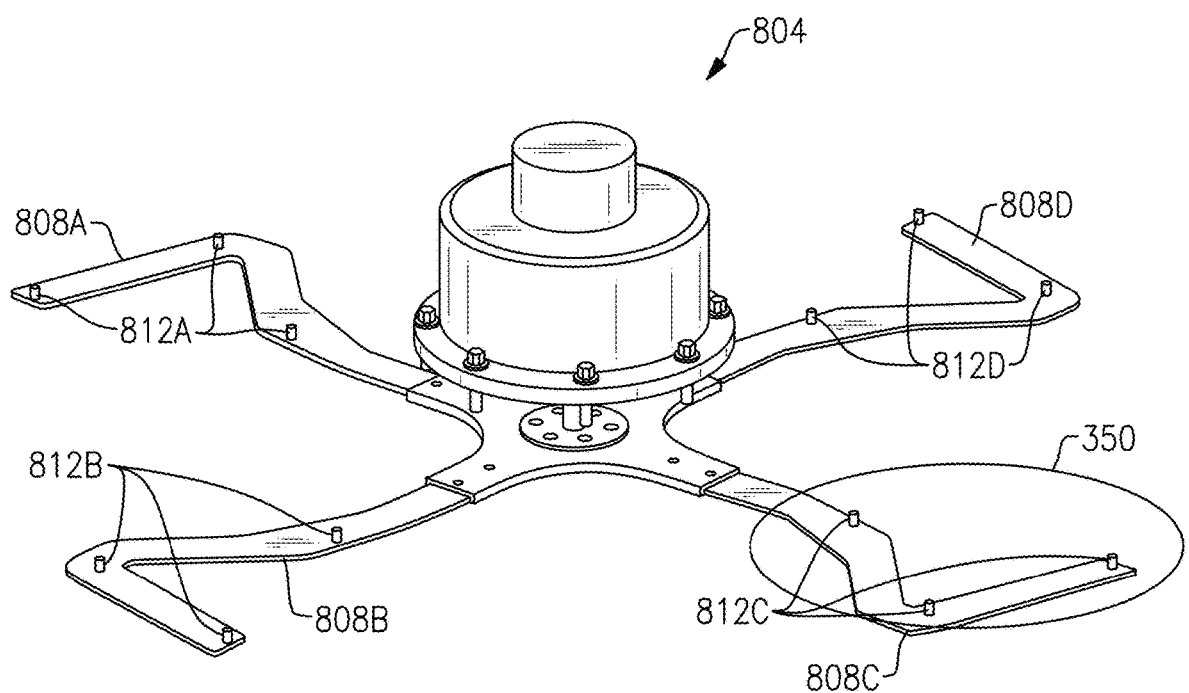
FIG. 8B is a perspective view of an indexer in the process chamber illustrated in FIG. 8A.

By way of example, in operation, to transfer a substrate to one of the susceptors 300A-300D from the transfer chamber 108 (FIG. 1A), e.g., the third susceptor 300C, the central shaft of the indexer 804 may first be rotated such that one of the indexer arms 808A-808D, e.g., the third indexer arm 808C, is placed over the fourth susceptor 300D adjacent the slot valve. Then, the robot arm having a substrate disposed on its end effector 134 may extend laterally from the transfer chamber through the slot valve to transfer the substrate. The end effector 134 may then be lowered in a vertical direction and/or the indexer 804 may be vertically raised, such that the substrate 350 rests on the pins 812C, as shown in FIG. 8B. Then, the indexer 804 may be rotated such that the substrate 350 is disposed over the third susceptor 300C. Then, the pins of the third susceptor 300C may be raised, and/or the indexer

804 may be lowered in the vertical direction, such that the substrate 350 rests on the pins of the third susceptor 300C. Thereafter, the pins of the susceptor 300C may be lowered to place the substrate 350 directly on the third susceptor 300C. In this manner, up to four substrates may be transferred to the first to fourth susceptors 300A-300D by sequentially placing the substrates on the pins 812A, 812B, 812C and 812D of the respective indexer arms 808A, 808B, 808C and 808D, and thereafterwards, placed on the respective susceptors 300A-300D. Transferring one or more substrates from the susceptor(s) 300A-300D to the transfer chamber may be achieved by performing these operations in reverse order.

It will be appreciated that, when the process chamber is a multi-station process chamber including multiple processing stations and multiple susceptors such as that described above with respect to FIG. 8A, existing methods for calibrating centered process positions can be particularly difficult and time consuming to implement. The difficulty arises in part due to the fact that, as described above with respect to FIG. 8A, the substrates are transferred to multiple susceptors using a single robot. As a result, when the robot is adjusted to center a substrate with respect to one of the susceptors, the adjustment can affect the process positions with respect to the remaining susceptors. Thus, calibrating centered process positions for all susceptors may be prohibitively time consuming unless accuracy is compromised. However, by using the methods disclosed herein, a significant amount of time can be saved with significantly less compromise in accuracy.

Referring back to FIG. 2A, when the calibration method 200A is performed on a multi-station process chamber such as the process chamber 104 illustrated in FIG. 8A, the method comprises securing 210 a calibration substrate on each of the multiple susceptors (300A-300D in FIG. 8A) in the processing chamber under an open chamber condition using multiple securing devices. The method additionally comprises closing the process chamber and subjecting 220 each of the calibration substrates to a process condition. The method additionally comprises sequentially transferring 230 each of the calibration substrates from a respective one of the susceptors using a robot arm. The method further comprises sequentially detecting 240 a position of each of the substrates while the calibration substrate is in transit from the respective susceptor and recording coordinates of the robot arm corresponding to the detected position of the each of the calibration substrates. By way of example, transferring 230 each of calibration substrates may be performed in by reversing the order of operations described above for transferring a substrate to the susceptor. For example, to transfer the calibration substrate from the third susceptor 300C to detect its position, pins of the third susceptor 300C may first be raised. Then, the indexer 804 may be rotated such that the third pins 812C of the third arm 808C are disposed under the calibration substrate. The pins of the third susceptor 300C may then be lowered, such that the calibration substrate rests on the pins of the third susceptor 300C. Then, the indexer 804 may be rotated such that the calibration substrate is disposed over the fourth susceptor 300D. The end effector 134 may then be inserted below the calibration substrate. The end effector 134 may be raised and/or the indexer 804 may be lowered in the vertical direction, such that the calibration substrate rests on the indexer 134. Thereafter, the robot arm having the calibration substrate disposed on its end effector 134 may retract laterally from the process chamber 104 towards the transfer chamber. As the calibration substrate is being retracted, a position of the calibration substrate may be detected (FIG. 2A) and the coordinates of the robot arm corresponding to the detected position may be recorded, in a similar manner as described above. In this manner, centered process positions for each of the four calibration substrates may calibrated by transferring then sequentially from the first to fourth susceptors 300A-300D to the transfer chamber. Once the centered process positions are calibrated in this manner for each of the process stations, the positions of semiconductor substrates to be subsequently processed can be adjusted real-time or "on the fly," e.g., as the semiconductor substrate is moving into the processing chamber from the transfer chamber, in a similar manner as described above with respect to FIG. 5 as modified for the multi-station chamber as described above with respect to FIG. 8A Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of calibrating a process position in a semiconductor process chamber, the method comprising:
    securing a calibration substrate on a susceptor in a processing chamber under an open chamber condition using a securing device, wherein the securing device further secures the susceptor, wherein the open chamber condition exposes the calibration substrate to an external atmosphere, and wherein securing comprises restraining a lateral movement of the calibration substrate such that the calibration substrate remains within a predefined tolerance from a centered position relative to a center of the susceptor;
    closing the processing chamber;
    subjecting the calibration substrate to a process condition comprising one or both of a higher process temperature and a lower process pressure relative the open chamber condition;
    transferring the calibration substrate from the susceptor using a robot arm; and
    detecting a position of the calibration substrate and recording coordinates of the robot arm corresponding to the detected position of the calibration substrate.

2. The method of claim 1, wherein securing the calibration substrate is performed manually.

3. The method of claim 1, further comprising removing the securing device from the processing chamber and processing a production substrate in the processing chamber.

4. The method of claim 1, wherein detecting the position comprises detecting while the calibration substrate is in motion from the susceptor.

5. The method of claim 1, wherein subjecting the calibration substrate to the process condition comprises one or both of subjecting the process chamber to a vacuum condition and subjecting the susceptor to a process temperature higher than a room temperature.

6. The method of claim 5, wherein transferring the calibration substrate from the susceptor comprises transferring while the susceptor is at the process temperature.

7. The method of claim 1, wherein subjecting the calibration substrate to the process condition causes the calibration substrate to shift in position from the centered position under the open chamber condition to a centered process position under the process condition, and wherein transferring the calibration substrate comprises transferring the calibration substrate from the susceptor at the centered process condition.

8. The method of claim 1, wherein detecting the position of the calibration substrate comprises detecting using a pair of light beams in a substrate transfer path between the process chamber and a transfer chamber connected to the process chamber.

9. The method of claim 8, wherein detecting using the pair of light beams comprises detecting two or more edge regions of the calibration substrate as the calibration substrate crosses the pair of light beams.

10. The method of claim 1, wherein the securing device is configured to prevent the calibration substrate from sliding laterally on the susceptor by more than 2 mm relative to the centered position.

11. The method of claim 1, wherein the securing device comprises a ring structure configured to fixedly surround the calibration substrate on the susceptor.

12. The method of claim 1, wherein the semiconductor process chamber comprises a plurality of susceptors, and wherein the method comprises:
    securing two or more calibration substrates on two or more of the susceptors in the processing chamber under the open chamber condition using two or more securing devices, wherein securing comprises restraining a lateral movement of each of the calibration substrates to prevent from sliding laterally on the respective susceptor by more than a predefined tolerance from a respective centered position relative to a respective susceptor center;
    subjecting the each of the calibration substrates to a respective process condition different from the open chamber condition;
    transferring the each of the calibration substrates sequentially from the respective susceptor using a robot arm; and
    detecting a position of the each of the calibration substrates while the each of the calibration substrates is in transit from the respective support susceptor and recording coordinates of the robot arm corresponding to the detected position of the each of the calibration substrate.

13. A method of processing a semiconductor substrate at a calibrated position in a process chamber, the method comprising:
    securing a calibration substrate on a susceptor in a processing chamber under an open chamber condition using a securing device, wherein the securing device further secures the susceptor, wherein the open chamber condition exposes the calibration substrate to an external atmosphere, and wherein securing comprises restraining a lateral movement of the calibration substrate such that the calibration substrate remains within a predefined tolerance from a centered process position relative to a center of the susceptor;
    closing the processing chamber;
    subjecting the calibration substrate to a process condition comprising one or both of a higher process temperature and a lower process pressure relative the open chamber condition while being restrained on the susceptor within the predefined tolerance from the centered process position by the securing device;
    transferring the calibration substrate from the susceptor using a robot arm and recording coordinates of the robot arm corresponding to a detected position of the calibration substrate along a substrate transfer path while the calibration substrate is in transit from the susceptor; and
    placing a production semiconductor substrate on the susceptor to be processed at the centered process position using the recorded coordinates of the robot arm.

14. The method of claim 13, further comprising, prior to placing the production semiconductor substrate on the susceptor, detecting a position of the production semiconductor substrate and adjusting the robot arm based on the detected position of the calibration substrate such that the production semiconductor substrate is placed on the susceptor at the centered process position.

15. The method of claim 14, wherein adjusting the robot arm based on the detected position of the calibration substrate comprises adjusting when the detected position of the production semiconductor substrate and the detected position of the calibration substrate are offset from each other by more than about 0.1 mm.

16. The method of claim 13, wherein prior to subjecting the calibration substrate to the process condition, securing the calibration substrate manually under an open chamber condition.

17. The method of claim 13, wherein subjecting the calibration substrate under the process condition comprises one or both of subjecting the process chamber to a vacuum condition and subjecting the susceptor to a process temperature higher than a room temperature.

18. The method of claim 17, wherein transferring the calibration substrate from the susceptor comprises transferring while the susceptor is at the process temperature.

19. The method of claim 13, wherein the detected position of the calibration substrate is obtained by detecting the position of the calibration substrate while transferring the calibration substrate using a pair of light beams in the substrate transfer path between the process chamber and a transfer chamber connected to the process chamber.

20. The method of claim 19, wherein detecting using the pair of light beams comprises detecting two or more edge regions of the calibration substrate as the calibration substrate crosses the pair of light beams.

21. The method of claim 13, wherein the securing device is configured to prevent the calibration substrate from sliding laterally on the susceptor by more than 2 mm relative to the centered process position that is centered relative to a susceptor center.

22. The method of claim 13, further comprising, removing the securing device after recording the coordinates of the robot arm and before placing the production semiconductor substrate on the susceptor to be processed.

23. The method of claim 13, wherein the semiconductor process chamber comprises a plurality of susceptors, and wherein the method comprises:

subjecting two or more calibration substrates on two or more of the susceptors to respective process conditions in the process chamber while being restrained on the two or more of the susceptors at respective process positions by two or more securing devices;

transferring the calibration substrates sequentially from the two or more of the susceptors using a robot arm and recording coordinates of the robot arm corresponding to detected positions of the calibration substrates along respective substrate transfer paths while the calibration substrates are in transit from the two or more of the susceptors; and placing two or more production semiconductor substrates on the two or more of the susceptors to be processed at the respective centered process positions using the recorded coordinates of the robot arm.

* * * * *